Oct. 10, 1961 S. YANDO 3,004,224

VARIABLE GAIN CIRCUIT WITH OUTPUTS EQUAL TO PRODUCT OF SELECTIVE INPUTS

Filed Oct. 4, 1956 2 Sheets-Sheet 1

INVENTOR
STEPHEN YANDO
BY Theodore Jay Jr.
ATTORNEY

Oct. 10, 1961 S. YANDO 3,004,224

VARIABLE GAIN CIRCUIT WITH OUTPUTS EQUAL TO PRODUCT OF SELECTIVE INPUTS

Filed Oct. 4, 1956 2 Sheets-Sheet 2

INVENTOR
STEPHEN YANDO
BY Theodore Jay Jr.
ATTORNEY 3,004,224

VARIABLE GAIN CIRCUIT WITH OUTPUTS EQUAL TO PRODUCT OF SELECTIVE INPUTS

Stephen Yando, Huntington, N.Y., assignor, by mesne assignments, to Sylvania Electric Products Inc., Wilmington, Del., a corporation of Delaware Filed Oct. 4, 1956, Ser. No. 614,012
3 Claims. (Cl. 328—160)

My invention relates to signal modifiers.

In my investigations of signal transformation apparatus of the type disclosed in my copending patent applications Serial No. 549,636, filed November 29, 1955, now abandoned, and Serial No. 603,070, filed August 9, 1956, now Patent 2,878,383, I have found it necessary to develop a new type of electronic apparatus for deriving, from at least one input signal having a predetermined amplitude characteristic, an output signal with modified amplitude characteristic. I define such apparatus as a signal modifier.

Accordingly, it is an object of the present invention to provide a new and improved signal modifier of the character indicated.

Another object is to provide a new and improved signal modifier for deriving, from at least one input signal having predetermined amplitude characteristics, an output signal having a modified amplitude characteristic.

Yet another object is to derive, from at least one input signal having predetermined amplitude characteristics, an output signal having modified amplitude characteristics.

Still another object is to provide a new and improved signal modifier for deriving, from a first input signal having a predetermined amplitude characteristic, an output signal having a modified amplitude characteristic, the amplitude characteristic being modified in accordance with a second signal derived from the first signal.

Yet a further object is to improve signal modifiers in such manner as to permit the generation of an output signal having an amplitude characteristic modified with respect to a predetermined amplitude characteristic of a first signal in accordance with a second signal derived from the first signal.

These and other objects of my invention will either be explained or will become apparent hereinafter.

In accordance with the principles of my invention, I provide a variable gain amplifier provided with first, second and third circuits. The first and second circuits are input circuits and the third circuit is an output circuit. One of the first and second circuits is an amplifier gain control circuit. First and second signals having time varying amplitudes are supplied to the first and second circuits respectively, the amplifier gain being varied in accordance with the amplitude of the one of the first and second signals supplied to the gain control circuit. Biasing means coupled to the first and second circuits condition the amplifier in a selected of first, second, third and fourth electric states. As a result, a third signal appears across the third circuit. This signal contains a product signal component having an amplitude proportional to the product of the amplitudes of the first and second signals.

When the amplifier is conditioned in the first state, the amplifier is inoperative in the absence of either one of the first and second signals, and the third signal contains only the product signal component.

Further, when the amplifier is conditioned in the second state, the amplifier is inoperative in the absence of the first signal, and the third signal contains both the product signal component and a second component proportional to the first signal.

Moreover, when the amplifier is conditioned in the third state, the amplifier is inoperative in the absence of the second signal, and the third signal contains both the product signal component and a second signal component proportional to the second signal.

Finally, when the amplifier is in the fourth state, the amplifier is operative in the presence or absence of either one of the first or second signals. Under these conditions, the third signal contains the product signal component, a second signal component proportional to the first signal and a third signal component proportional to the second signal.

The amplifier can further be provided with a fourth circuit which is an additional output circuit. When the amplifier is in any of the four states, a fourth signal will appear across the fourth circuit. The fourth signal will be proportional to the selected one of the first and second input signals supplied to the gain control circuit and will also be in phase with the one input signal. When the amplifier is in any of its second, third and fourth states, the third and fourth signals can be summed to produce an output signal in which the additional signal component of the third signal proportional to the selected one signal has been eliminated. (This action occurs because this additional signal component is necessarily in phase opposition with the fourth signal and hence mutual cancellation can occur.)

I further provide means to derive the second signal from the first signal in such manner that the second signal is proportional to the absolute value of a selected one of N different derivatives of the first signal, N being any positive integer, or alternatively, is proportional to the sum of the absolute values of a plurality of different selected ones of N different derivatives of the first signal.

Illustrative embodiments of my invention will now be described with reference to the accompanying drawings, wherein—

FIG. 1 is a diagram illustrating certain principles of the invention;

FIGS. 2*a* and 2*b* are graphs of the wave forms of the signals and voltages utilized in the apparatus shown in FIG. 1;

Figure 1:
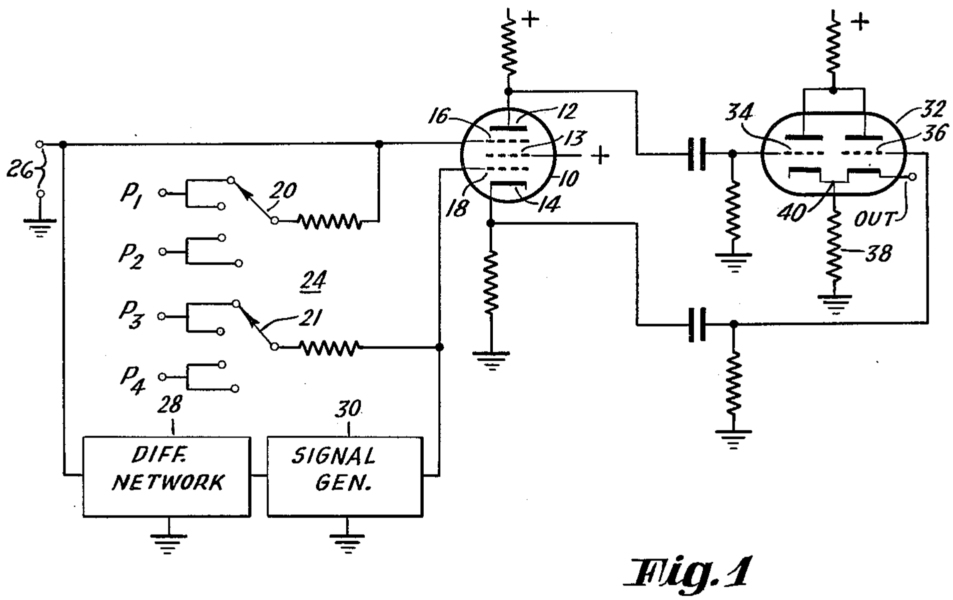
Figure 2A:
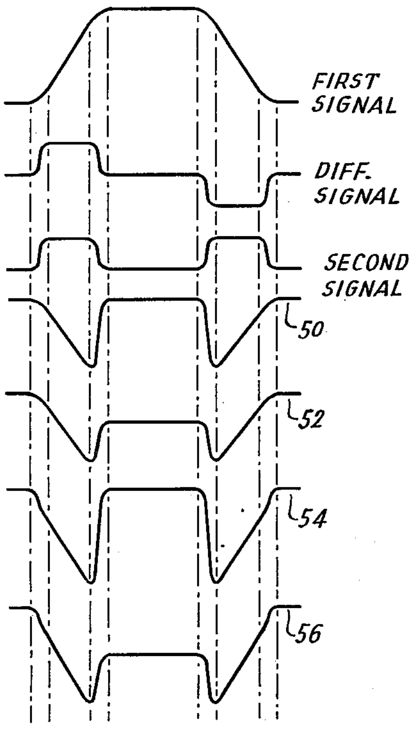

Referring now to FIG. 1, there is shown a variable gain amplifier comprising a pentode tube 10 (as for example the type commercially designated as a 6AS6). The anode 12 of this tube is connected through a load resistor to a first point of positive potential. The screen grid 13 is connected to a second point of positive potential. The cathode 14 is grounded through a cathode resistor. The suppressor grid 16 and the control grid 18 are connected to corresponding arms 20 and 21 of a double pole switch 24 having four different switch positions. A first signal, having in this example the wave form shown in FIG. 2*a*, appears at input terminals 26 and is supplied to the suppressor grid 16 of pentode tube 10.

The first signal is also supplied to the input of differentiation network 28 which differentiates the first signal one or more itmes to produce a signal proportional to a selected one of N derivatives of the incoming signal, N being any positive integer. In this example, as will be more apparent from a study of FIG. 2*a*, the differentiated signal is proportional to the first derivative.

The differentiated signal yielded by network 28 is then supplied to a signal generator 30. Generator 30 derives from the differentiated signal a second signal proportional to the absolute value of the first derivative of the first signal. The second signal is supplied to the control grid 18 of tube 10.

I further provide a conventional adder or summation circuit which in this example comprises a dual triode 32. The anode 12 and cathode 14 are both capacitively coupled to the respective control grids 34 and 36 of dual triode 32. Due to the feedback action of the cathode resistor 38 the signals appearing at the anode and cathode of tube 10 are linearly summed together in the circuit of dual troide 32 and an output signal, proportional to the summation of these signals, appears at the junction 40 of the cathode resistor and cathodes of tube 32.

When switch 24 is in the position shown in FIG. 1, the suppressor and control grids of tube 10 are connected to respective points of biasing potential identified as $P_1$ and $P_3$ respectively; by adjusting the switch position, these grids can be connected to different points of biasing potentials $P_1$, $P_4$ or $P_2$, $P_3$ or $P_2$, $P_4$.

As indicated previously, tube 10 acts as a variable gain amplifier. More particularly, the second signal, being applied to the control grid 18 controls the total amount of space current emitted by cathode 14, while the first signal, being applied to the suppressor grid 16, determines the percentage or fraction of the total space current that can flow through the screen grid 13 to the anode 12.

As a result, tube 10 yields at its anode 12 a third signal derived from both the first and second signals. The gain of one of the first and second signals as it passes through the tube is varied or modified in accordance with the amplitude variations in the other of these first and second signals. The effect of this variable gain is to insure that, regardless of the position of switch 24, the third signal contains a signal component having an amplitude proportional to the product of the amplitudes of the first and second signals.

If desired, the second signal can be applied at the suppressor grid while the first signal is applied at the control grid, and the same action will ensue.

When the switch 24 is in the position shown, the tube 10 is biased to be non-conductive in the absence of either of the first and second signals. In this situation, the third signal contains only the product signal component described above and hence has the wave form indicated at 50 in FIG. 2*a*.

However, when the switch connects the suppressor and control grids to potentials $P_1$ and $P_4$, the tube 10 is biased to be non-conductive only upon the absence of the first signal. Then, the third signal contains not only the product signal component but also a component proportional to the first signal, and hence has the wave form identified at 52.

Further, when the switch connects the suppressor and control grids to potentials $P_2$ and $P_3$, the tube is biased to be non-conductive only upon the absence of the second signal. The third signal under these conditions contains not only the product signal component but also a component proportional to the second signal as shown at 54 in FIG. 2*a*.

Finally, when the switch connects the suppressor and control grids to potentials $P_2$ and $P_4$, the tube is biased to be conductive in the presence or absence of either signal. The third signal then contains the product signal component, a component proportional to the first signal and a component proportional to the second signal, as shown at 56 in FIG. 2*a*.

The generation of these various third signal components can be explained in the following manner. When tube 10 is rendered conductive in the absence of both first and second signals, a direct current, the magnitude of which is determined by the bias potentials $P_2$ and $P_4$, flows in the anode circuit of tube 10, thus producing a direct current component.

Further, when only one of the first and second signals is present, tube 10 acts as a conventional amplifier, and this one signal appears in amplified form in the anode circuit of tube 10. However, when both first and second signals are present, the variable gain action of tube 10 causes the product signal component to be produced in the anode circuit. Hence, depending upon the biasing conditions, the wave forms of the third signal varies in the manner indicated in FIG. 2*a*.

Due to the isolating action of the screen grid 13 of tube 10, the current flowing in the cathode circuit of tube 10 does not depend upon the variations of both the first and second signals, but is proportional only to the signal applied to the control grid (which in this example is the second signal). Hence, appearing at the cathode 14 of tube 10 is a fourth signal proportional to the second signal.

When tube 10 is biased so that the third signal contains the product signal and a component proportional to the second signal, the circuit parameters can be adjusted so that the amplitude of the second signal component of the third signal is equal to that of the fourth signal.

Figure 2B:
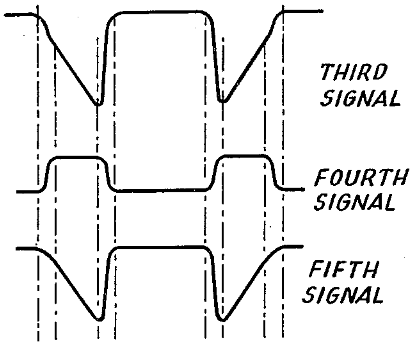

Since the fourth signal and the second signal component of the third signal are necessarily opposed in phase, the third and fourth signals can be added together to produce a fifth signal which contains only the product signal component of the second signal. The appropriate wave forms are shown in FIG. 2*b*.

The summation action is provided by tube 32, the fifth signal appearing at the cathode 40 of tube 32.

Figure 3:
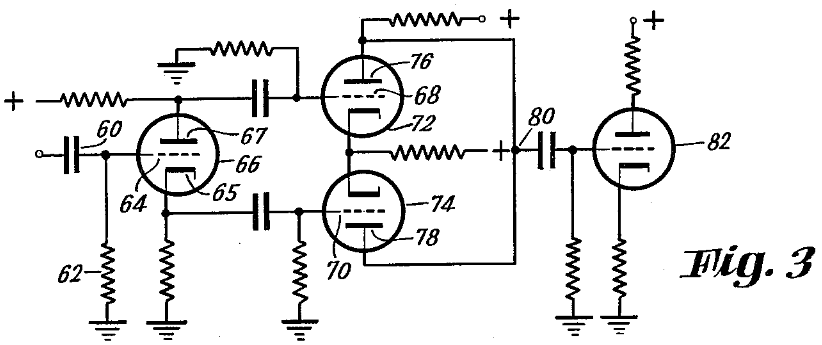
FIG. 3 is a schematic diagram of the differentiation network and signal generator shown in FIG. 1.
Figure 4:
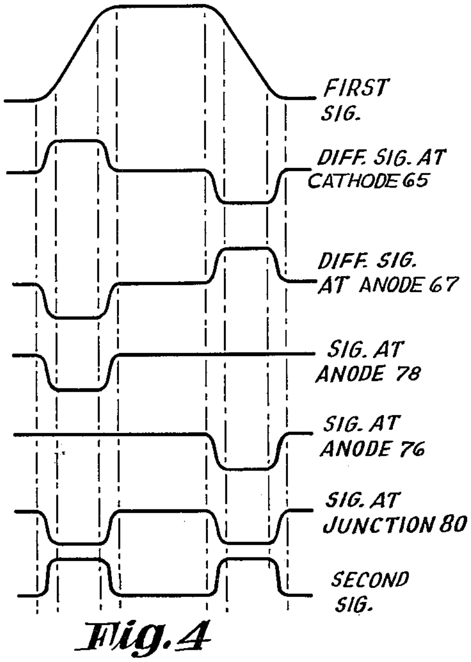
FIG. 4 is a graph of the wave forms of the signals and voltages utilized in the apparatus shown in FIG. 3.

FIG. 3 further illustrates, in schematic form, a typical differentiation network and a signal generator of the type shown in block form in FIG. 1. The differentiation network, as is conventional, comprises a capacitor 60 and a resistor 62 in series connection. The voltage appearing across resistor 62 is supplied to the control grid 64 of a triode tube 66. Tube 66 functions as a paraphase amplifier which converts the single differentiated signal into two push-pull signals (as shown in FIG. 4), one of which appears at the cathode 65 of tube 66. These two signals are respectively supplied to the control grids 68 and 70 of triode tubes 72 and 74 respectively. Each of tubes 72 and 74 is biased to be non-conductive except when the incoming signal supplied thereto has positive polarity. The anodes 76 and 78 of tubes 72 and 74 are tied together at a junction 80. These two tubes, therefore, because of the push-pull relationship of the signals supplied to their grids, each conduct over alternate half cycles and always yield an output voltage of negative polarity (as shown in FIG. 4). The two output voltages are combined at 80 to produce a common output voltage of negative polarity which is proportional to the absolute value of the differentiated signal. This negative voltage is then fed through a conventional triode amplifier 82 to produce an output voltage having positive polarity (as shown in FIG. 4). This positive voltage is the second signal and is supplied to the control grid 18 of tube 10.

In the apparatus of FIGS. 1 and 3, the second signal is proportional to the absolute value of the first derivative of the first signal. However, it will be apparent that by successively differentiating the first signal as often as desired (for example, by utilizing two or more differentiation networks connected in cascade), the second signal can be made proportional to the absolute value of any selected one of N derivatives of the first signal, N being any positive integer.

Figure 5:
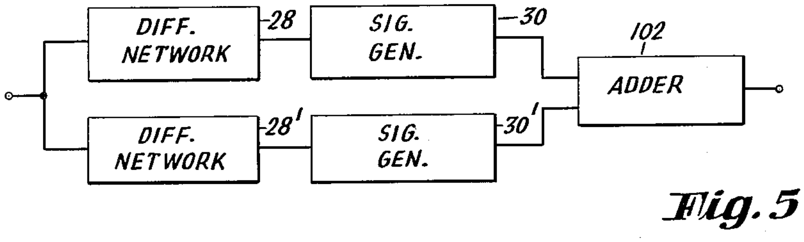
FIG. 5 is a block diagram showing apparatus which can be substituted for the differentiation network and signal generator of FIG. 1.

Further, by separately obtaining a plurality of second signal components in this manner, each component being proportional to the absolute value of a different selected one of N derivatives, each voltage of the first signal, and then adding these components together, a second signal proportional to the sum of these components can be produced, as shown in FIG. 5.

In FIG. 5, there is shown a differentiation network 28 and a signal generator 30 connected together in the manner shown in FIGS. 1 and 3. There is also provided another differentiation network 28' and another signal generator 30' coupled together in the same manner.

Figure 6:
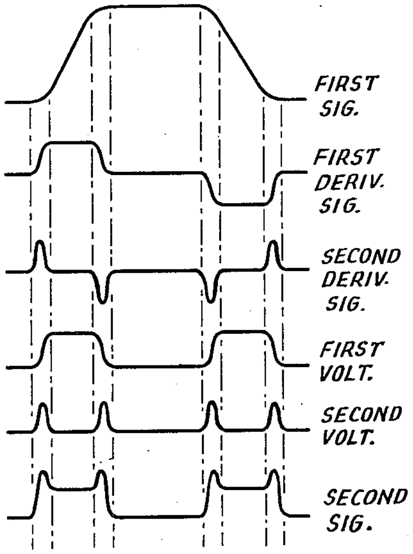
FIG. 6 is a graph of the wave forms of the signals and voltages utilized in the apparatus shown in FIG. 5.

The inputs of both differentiation networks are tied together and the outputs of both signal generators are coupled to the input of an adder or summation circuit 102 (which can be for example of the type shown in FIG. 1). The network 28, as before, produces a signal proportional to the first derivative of the incoming signal, while network 28' produces a signal proportional to the second derivative of the incoming signal. Both signal generators function in the manner previously described, generator 30 producing a first voltage proportional to the absolute value of the first derivative of the incoming signal, while generator 30' produces a second voltage proportional to the absolute value of the second derivative of the incoming signal. These two voltages or second signal components are then summed or added together in the adder 102 to produce a second signal which represents the sum of both components. The appropriate wave forms are shown in FIG. 6.

It will be apparent that the number of networks and generators can be increased as necessary to produce a second signal proportional to the sum of any given plurality of second signal components.

While I have shown and pointed out my invention as applied above, it will be apparent to those skilled in the art that many modifications can be made within the scope and sphere of my invention as defined in the claims which follow.

What is claimed is:

1. A signal modifier comprising an electron tube having first and second control elements; first and second input terminals, said first input terminal being coupled directly to said first control element and said second input terminal being coupled to a common reference point; differentiating means coupled to said first input terminal, generator means coupled to said differentiating means and to said second control element, said generator means applying a voltage to said second control element corresponding to the absolute value of the output of said differentiating means, first biasing means coupled to said first control element, said first biasing means being adapted for selectively coupling either a first or second bias voltage to said first control element, second biasing means coupled to said second control element, said second biasing means being adapted for selectively coupling either a third or fourth bias voltage to said second control element, and impedance means coupled between the cathode of said electron tube and said common reference point, the voltage across said impedance means being proportional to the voltage applied to said second control element.

2. A signal modifier as defined in claim 1 wherein said differentiating means produces the first time derivative of a signal applied between said first and second input terminals, said derivative being coupled to said generator means.

3. A signal modifier as defined in claim 1 further comprising a summing circuit having first and second input circuits and an output circuit, said first input circuit being coupled to the plate of said electron tube and said second input circuit being coupled to the cathode of said electron tube.

References Cited in the file of this patent

UNITED STATES PATENTS

| | | |
|---|---|---|
| 2,376,392 | Shepherd | May 22, 1945 |
| 2,388,769 | Shaffer | Nov. 13, 1945 |
| 2,484,352 | Miller et al. | Oct. 11, 1949 |
| 2,688,077 | White et al. | Aug. 31, 1954 |
| 2,716,189 | Ayres | Aug. 23, 1955 |
| 2,777,947 | Hoeppner et al. | Jan. 15, 1957 |
| 2,785,377 | MacFee et al. | Mar. 12, 1957 |
| 2,793,347 | Clark | May 21, 1957 |
| 2,806,949 | Smith | Sept. 17, 1957 |
| 2,831,971 | Wischmeyer | Apr. 22, 1958 |
| 2,848,161 | Woll | Aug. 19, 1958 |